United States Patent [19]

Barabi et al.

[11] Patent Number: 5,629,837
[45] Date of Patent: May 13, 1997

[54] BUTTON CONTACT FOR SURFACE MOUNTING AN IC DEVICE TO A CIRCUIT BOARD

[75] Inventors: Nasser Barabi, Lafayette; Iraj Barabi, Danville, both of Calif.

[73] Assignee: Oz Technologies, Inc., Oakland, Calif.

[21] Appl. No.: 531,367

[22] Filed: Sep. 20, 1995

[51] Int. Cl.[6] .................................................. H05K 1/00
[52] U.S. Cl. ........................ 361/767; 361/768; 174/261; 257/739
[58] Field of Search ............................ 361/767, 768, 361/770, 777; 174/260, 250, 261; 257/737, 739

[56] References Cited

U.S. PATENT DOCUMENTS

| | | | |
|---|---|---|---|
| 3,344,316 | 9/1967 | Selmak | 317/101 |
| 3,877,051 | 4/1975 | Calhoun et al. | 357/15 |
| 4,089,575 | 5/1978 | Grabbe | 339/17 CF |
| 4,351,580 | 9/1982 | Kirkman et al. | 339/17 CF |
| 4,583,806 | 4/1986 | Tainter, Jr. et al. | 339/17 MP |
| 4,647,134 | 3/1987 | Nonaka | 339/17 M |
| 4,747,784 | 5/1988 | Cedrone | 439/71 |
| 4,789,345 | 12/1988 | Carter | 439/71 |
| 4,846,704 | 7/1989 | Ikeya | 439/72 |
| 4,954,088 | 9/1990 | Fujizaki et al. | 439/73 |
| 5,062,802 | 11/1991 | Grabbe | 439/72 |
| 5,097,101 | 3/1992 | Trobough | 174/254 |
| 5,121,299 | 6/1992 | Frankeny et al. | 361/413 |
| 5,158,467 | 10/1992 | Grabbe et al. | 439/71 |
| 5,273,440 | 12/1993 | Ashman et al. | 439/71 |
| 5,291,375 | 3/1994 | Mukai | 361/760 |
| 5,307,561 | 5/1994 | Figenbaum et al. | 29/846 |
| 5,345,365 | 9/1994 | Herndon et al. | 361/760 |
| 5,347,086 | 9/1994 | Potter et al. | 174/261 |
| 5,376,010 | 12/1994 | Peterson | 439/71 |
| 5,481,205 | 1/1996 | Frye et al. | 324/757 |

*Primary Examiner*—Laura Thomas
*Attorney, Agent, or Firm*—Donald L. Beeson

[57] ABSTRACT

A button contact and array of button contacts are provided for surface mounting a leadless IC device to a circuit board. The button contacts of the button contact array have a substantially flat body lying in a plane and oppositedly directed contact points protruding from resiliently deflectable contact support arms of said body. The button contacts of the invention, which provide a low profile contact between surface mounted components, are suitable for high frequency applications, and particularly high frequency test and burn-in applications, and are relatively durable.

17 Claims, 2 Drawing Sheets

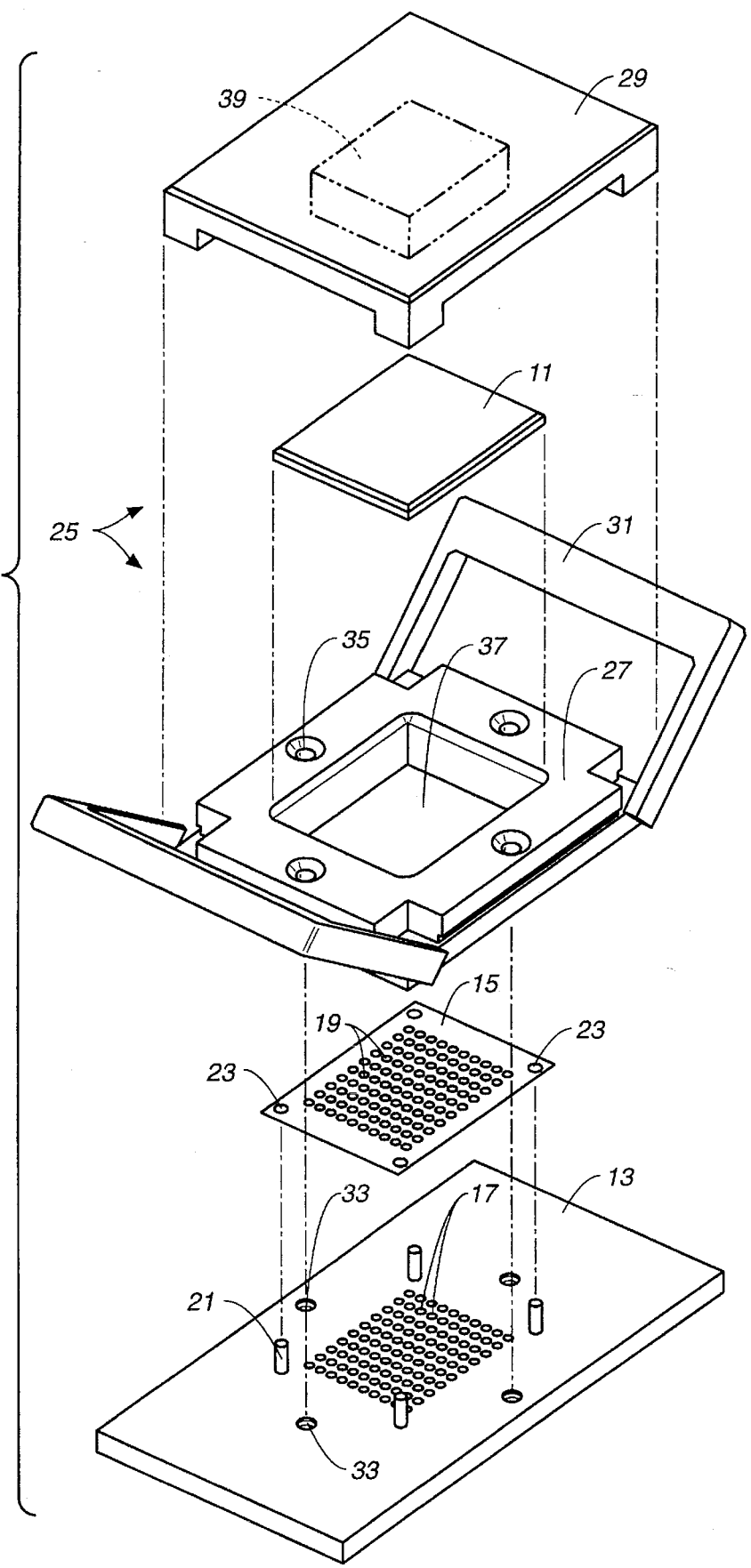

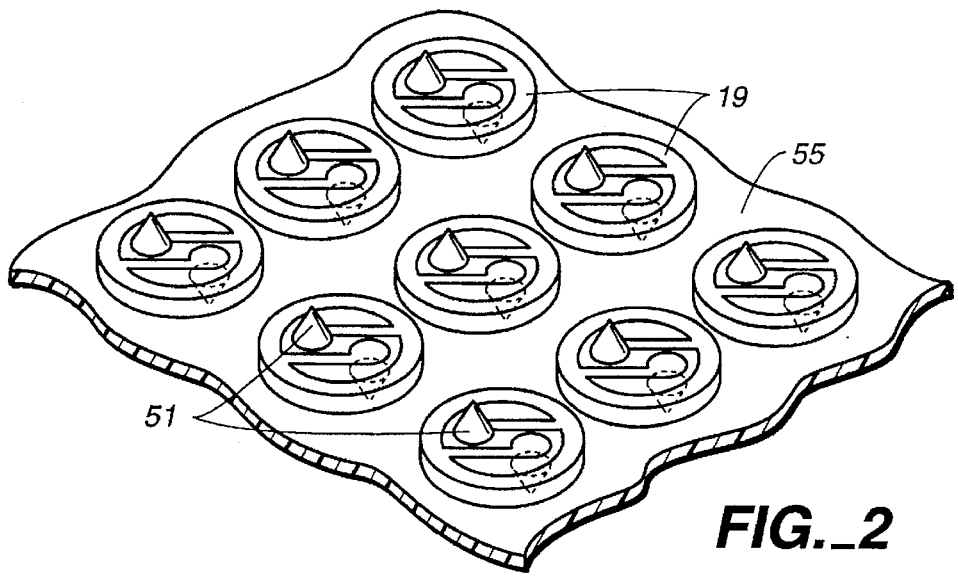
FIG._2
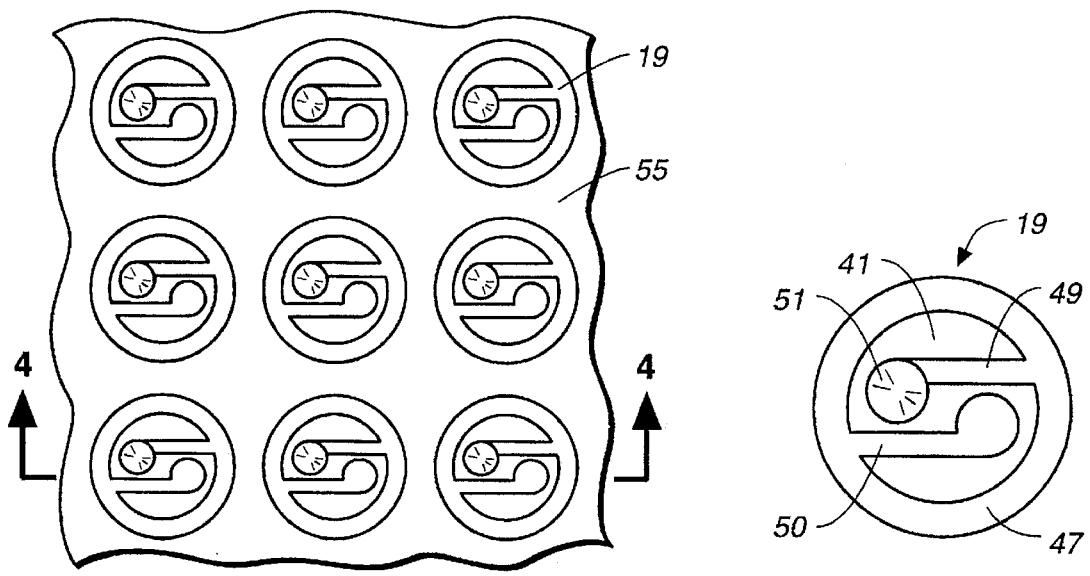
FIG._3  FIG._3A
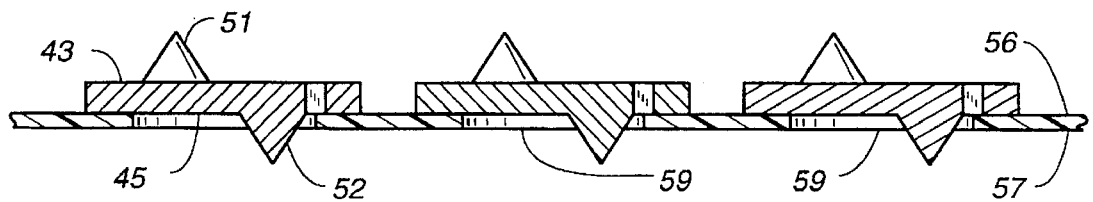
FIG._4

BUTTON CONTACT FOR SURFACE MOUNTING AN IC DEVICE TO A CIRCUIT BOARD

BACKGROUND OF THE INVENTION

The present invention generally relates to surface mounted integrated circuit (IC) devices, and more particularly to achieving a solderless connections between a leadless IC device and a printed circuit (PC) board. The invention finds particular application in connection with the burn-in and test of leadless IC devices such as used with ball grid array (BGA) surface mount techniques.

The increased capabilities of IC chips have led to increased input/output (I/O) densities and alternative techniques for surface mounting IC chips to printed circuit (PC) boards involving leadless IC chips. For example, BGA mounting techniques have been developed to replace pin grid array (PGA) mounting approaches in order to achieve more densely packed contacts and smaller contact dimensions (in the order of 25 mils.). To facilitate the testing and burn-in such IC devices, special test sockets have been devised to hold these devices and to temporarily connect them to a PC test board. Test sockets for leadless IC devices most commonly employ stamped or formed metal contact pins for achieving electrical interconnection between the I/O contacts of the IC device being tested and the PC test board circuits. Such socket designs have a relatively high profile and relatively high capacitance and inductance making them undesirable for high speed applications. They also require soldering of the socket pins to the PC board and do not operate efficiently with IC devices having non-compliant I/O contacts. Sockets having elastomeric contactors which do not require soldering have also been devised. These sockets utilize flexible wire filaments which extend in a perpendicular relation to the contact points. Such wire filaments are generally not reliable and will not hold up with repetitive use. In addition, they are not likely to withstand the thermal shock encountered while testing an IC device.

The present invention overcomes the disadvantages of conventional sockets for leadless IC devices by providing a solderless electrical interconnection between a PC board and the IC device which is suitable for high frequency circuits, which will operate at extreme temperatures, and which withstands repeated insertions and extractions of the IC device from the IC socket. While the invention is particularly suited to use with sockets for test and burn-in procedures, it can be used in any application requiring the surface mounting of a leadless IC device to a PC board.

SUMMARY OF THE INVENTION

Briefly, the present invention provides for button contacts which can be produced in a miniaturized form for surface mounting a leadless IC device to a printed circuit board without the need for soldered connections. Each button contact includes a body having opposed contact faces. The body of the button contact, which can be suitably fabricated in approximately 5 mil. metal sheet material such as beryllium copper, lies in a plane and provides a conductive path of a substantial cross-section between its two contact faces. At least one contact point protrudes from at least one of the opposed contact faces of the body, and preferably two oppositely directed contact points will be provided, one for each of the body's opposed contact faces. The contact points, which suitable can be gold points bonded to the faces of the body, act to extend the conductive path between the contact faces in a direction generally perpendicular to the plane of the body. These contact points are inwardly displaceable to accommodate any lack of coplanarity in the contact surfaces of the surface mounted components. To permit repeated use and to provide an efficient contact, the contact points of the button contacts are also preferably resiliently displaceable so as to provide a spring-loaded contact.

In the preferred embodiment of the invention, the body of the button contact is comprised of a perimeter portion and deflectable contact support portions extending of the perimeter portion for carrying the contact points. Suitably the deflectable contact support portions of the body are in the form of resiliently deflectable contact support arms which extend inwardly of the perimeter portion, with the contact points being positioned at the distal end of the support arms.

A contact button array that matches the I/O contacts of a surface mounted IC device is provided by securing a plurality of button contacts in accordance with the invention to one side of a thin insulator backing material, preferably a polymide material such as Kapton™ tape, and etching out portions of the backing material at the point of securement of the plurality of button contacts to expose their face-down contact points.

Therefore, a primary object of the present invention is to provide an efficient, solderless contact between a leadless IC device and a PC board. Another object of the invention is to provide a contact which has a low profile, and low capacitance and inductance characteristics. It is a further object of the invention to provide a contact which can withstand the thermal stress of burn-in and test applications. Yet objects of the invention will be apparent from the following specification and claims.

DESCRIPTION OF THE DRAWINGS

FIG. 1 is an exploded perspective view of a test socket for an IC device utilizing a button contact array in accordance with the present invention.

FIG. 2 is an enlarged fragmentary view of a portion of the button contact array shown in FIG. 1.

FIG. 3 is a top plan view of the button contact array shown in FIG. 2.

FIG. 3A is an enlarged top plan view of an individual button contact as shown in FIG. 3.

FIG. 4 is a cross-sectional view in side elevation of the button contact array of FIG. 3 taken along section lines 4—4.

DETAILED DESCRIPTION OF THE ILLUSTRATED EMBODIMENT

Turning now to the drawings, FIG. 1 illustrates the means by which a leadless IC device 11 can be surface mounted to a PC board 13 by means of a contact button array 15 in accordance with the invention. In the FIG. 1 assembly, the button contact array elements are the sole means by which the I/O contacts (not shown) of the IC device are electrically interconnected to their corresponding circuit contacts 17 on the PC board.

The button contact array, which is further described below, is a generally thin, flexible, and rectangularly shaped element that can be sandwiched between the IC device and the PC board. The array is seen to have a plurality of individual contacts 19 generally shaped like buttons and arranged in a rectangular matrix which causes the button contacts to overlie the individual circuit contacts of the circuit contact array 17 of the PC board. Locator pins 21 and locator holes 23 are provided, respectively, on the PC board and the button contact array to permit precise location of the array. The IC chip 11 is in turn mounted over the button contact array by means of carrier assembly 25 which includes a carrier frame 27, cover plate 29, and hold-down latches 31. It is noted that the locator pins 21 on the PC board are also used to align the carrier frame. This is done by providing the bottom of the carrier frame with locator pin holes (not shown).

To ensure that a good electrical interconnection is achieved through the button contact array, the IC chip 11 must be mounted firmly to the PC board. In the FIG. 1 embodiment, this is accomplished by first screwing the carrier frame 27 into the threaded holes 33 in the PC board through screw openings 35 of the carrier frame. Flat head screws (not shown) are most suitably used for this purpose. With carrier frame 27 securely mounted to PC board 13 over button contact array 15, the IC device 11 can be received by and firmly held in the carrier frame by inserting the IC device into the frame's central opening 37 and placing the assembly's cover plate 29 over carrier frame 27 such that the cover plate's bottom plug 39 (shown in phantom lines) extends into opening 37 to press against the top of the IC device. Latches 31 are then closed to firmly hold the assembly together.

FIGS. 2–4 show the individual button contacts and button contact array of the invention in greater detail. Referring to these figures, it is seen that the button contacts 19 include a substantially flat body 41 which lies in a plane and which has two opposed, oppositely directed contact faces 43, 45. The body of the button contact is made up of a perimeter portion 47 and two resiliently deflectable contact support portions in the form of two parallel and resiliently deflectable contact support arms 49 which extend inwardly toward each other from opposite sides of the perimeter portion. Oppositely directly contact points 51, 52 are provided at the distal end of support arms 49, 50 such that one contact 5point protrudes from the opposed faces of the contact button. The contact points are suitably gold bumps bonded onto the ends of the support arms. Alternatively, protruding contact points can be provided by bending the tips of the support arms in a direction perpendicular to the plane of the contact button or through other fabrication processes, including a particle interconnect process wherein abrasive diamond chips are embedded on the support arms. In any event, the contact points will be conductive, and will act to extend the conductive path between the contact faces of the body in a direction which is generally perpendicular thereto.

It is noted that because the support arms 49, 50 can be resiliently deflected, the contact points 51, 52 of the button contacts are inwardly displaceable when the contacts are sandwiched between the I/O contacts of an IC device and circuit contacts of a printed circuit board. The resiliency of the contact support arms will also spring-load the contact points to produce a contact force against the contact surfaces adjacent the button faces. Thus, the contact buttons of the invention can adapt to coplanarity irregularities in the surface mount environment, while maintaining good electrical contact with contact surfaces. Button contacts made of hardened beryllium copper will provide suitable resiliency to give the contacts the spring-like properties desired.

Further referring to FIGS. 2–4, an array of button contact is provided by adhering a plurality of button contacts 19 in accordance with the invention to a thin insulator backing 55, which is suitably a strip of Kapton™ tape approximately 3 mil. in thickness. The insulator backing 55 has a defined first side 56 which provides an adhesive surface and to which the button contacts are adhered in a predetermined array, and a second side 57 which forms the back of the button contact array. To permit contact point 52 of button contacts 19 to project through the insulator backing 55, openings 59 are suitably etched into the insulator backing to expose these contact points. Such an etching process would be well known to persons skilled in the art.

Therefore, it can be seen that the present invention provides an electrical interface between a leadless IC device and a circuit board by means of button contacts having a low profile and a substantial conductor path. Button contacts and button contact arrays provided in accordance with the invention will have relatively low capacitance and inductance, will be suitable for high frequency applications, and will be durable enough to withstand thermal shock and repetitive insertions and extractions of IC devices into and from an IC socket, such as occurs in test and burn-in applications. While the present invention has been described in considerable detail in the foregoing specification and claims, it shall be understood that it is not intended that the invention be limited to such detail, except as necessitated by the following claims.

We claim:

1. A button contact for surface mounting an IC device to a circuit board, said button contact comprising
    a body lying in a plane and having opposed contact faces, said body providing a conductive path between the contact faces thereof, and
    at least one contact point protruding from at least one of the opposed contact faces of said body, said contact point acting to outwardly extend the conductive path between the contact faces of said body in a direction generally perpendicular to the plane of said body and being inwardly displaceable toward the plane of said body.

2. The button contact of claim 1 wherein said contact point is resiliently displaceable.

3. The button contact of claim 1 wherein said body is comprised of a perimeter portion and at least one deflectable contact support portion extending internally of said perimeter portion, and wherein said contact point protrudes from said deflectable support portion.

4. The button contact of claim 1 wherein at least one contact point protrudes from each of the contact faces of said body to provide at least two oppositely directed and displaceable contact points.

5. A button contact for surface mounting an IC device to a circuit board, said button contact comprising
    a substantially flat body lying in a plane and having opposed contact faces, said body including at least one resiliently deflectable contact support arm, and
    a contact point protruding from said contact support arm, said contact support arm being resiliently deflectable to permit said contact point to be displaced toward to the plane of said body, and
    said body providing a conductive path between the opposed contact faces of said body and said contact point acting to extend said conductive path in a direction perpendicular to the plane of said body.

6. The button contact of claim 5 wherein said body has first and second resiliently deflectable contact support arms, and wherein at least two oppositely directed, displaceable contact points are provided, one of said contact points protruding from said first contact support arm and the other of said contact points protruding from the other of said contact support arms.

7. The button contact of claim 5 wherein said body has a perimeter portion and first and second resiliently deflectable contact support arms extending inwardly of said perimeter portion, wherein oppositely directed, displaceable contact points are provided, and wherein one of said contact points protrudes from said first contact support arm and the other of said contact points protrudes from the other of said contact support arms.

8. A button contact for surface mounting an IC device to a circuit board, said button contact comprising a substantially flat electrically conductive body lying in a plane and having opposed contact faces, said body including a perimeter portion and first and second resiliently deflectable contact support arms extending inwardly of said perimeter portion, and a contact point protruding from each of said first and second contact support arms, the contact point on said first contact support arm being oppositely directed from the contact point on the said second contact support arm, said contact support arms being resiliently deflectable to permit said contact points to be displaced toward the plane of said body.

9. The button contact of claim 8 wherein said first and second contact support arms have free distal ends, and wherein said contact points protrude from the distal ends of said support arms.

10. The button contact of claim 8 wherein said body is a sheet metal part.

11. The button contact of claim 8 wherein said body is fabricated of beryllium copper.

12. The button contact of claim 8 wherein the perimeter portion of said body is a circular ring.

13. The button contact of claim 8 wherein said contact points are in the form of gold contact points bonded to said contact support arms.

14. A button contact array for surface mounting an IC device to a circuit board, said button contact assembly comprising a thin flexible insulator backing lying in a plane and having a first side and a second side, a plurality of button contacts secured to the first side of said base to provide an array of electrically conductive contacts, each of said button contacts comprising a substantially flat body lying substantially in the plane of said film insulator backing and having opposed contact faces, said body providing a conductive path between the contact faces thereof, and oppositely directed contact points, one of said contact points protruding from each of the opposed contact faces of said body, said contact points acting to extend the conductive path between the contact faces of said body in a direction perpendicular to the plane of said body and being displaceable in relation to the plane of said body, said thin insulator backing having etched out portions at the point of securement of each of said plurality of button contacts to expose the contact points thereof on the second side of said insulator backing.

15. The button contact array of claim 14 wherein said contact points are resiliently displaceable.

16. The button contact array of claim 14 wherein the body of said button contacts are fabricated entirely of a conductive material.

17. The button contact array of claim 16 wherein said conductive material is beryllium copper.

* * * * *